(12) United States Patent
Doerner et al.

(10) Patent No.: US 7,382,590 B2
(45) Date of Patent: Jun. 3, 2008

(54) MR SENSOR AND THIN FILM MEDIA HAVING ALLOYED RU ANTIPARALLEL SPACER LAYER FOR ENHANCED ANTIPARALLEL EXCHANGE COUPLING

(75) Inventors: Mary Frances Doerner, Santa Cruz, CA (US); Eric Edward Fullerton, Morgan Hill, CA (US); Wen-yaung Lee, San Jose, CA (US); Jinshan Li, San Jose, CA (US); Brian R. York, San Jose, CA (US)

(73) Assignee: Hitachi Global Storage Technologies Netherlands B.V., Amsterdam (NL)

( * ) Notice: Subject to any disclaimer, the term of this patent is extended or adjusted under 35 U.S.C. 154(b) by 389 days.

(21) Appl. No.: 11/047,801

(22) Filed: Jan. 31, 2005

(65) Prior Publication Data

US 2006/0171084 A1   Aug. 3, 2006

(51) Int. Cl.
*G11B 5/39* (2006.01)
(52) U.S. Cl. .............................. 360/324.11
(58) Field of Classification Search ........ 360/324.11, 360/324.2; 428/828.1
See application file for complete search history.

(56) References Cited

U.S. PATENT DOCUMENTS

| | | | |
|---|---|---|---|
| 5,147,732 A | 9/1992 | Shiroishi et al. | 428/668 |
| 5,701,222 A | 12/1997 | Gill et al. | 360/113 |
| 5,768,069 A | 6/1998 | Mauri | 360/113 |
| 5,843,569 A | 12/1998 | Kaitsu et al. | 428/323 |
| 5,851,643 A | 12/1998 | Honda et al. | 428/212 |
| 6,077,586 A | 6/2000 | Bian et al. | 428/65.3 |
| 6,292,336 B1 | 9/2001 | Horng et al. | 360/324.12 |
| 6,548,114 B2 | 4/2003 | Mao et al. | 427/255.7 |
| 6,671,139 B2 | 12/2003 | Carey et al. | 360/324.12 |
| 6,689,497 B1 | 2/2004 | Girt | 428/694 |
| 6,738,236 B1 | 5/2004 | Mao et al. | 360/324.11 |
| 6,821,652 B1 * | 11/2004 | Okamoto et al. | 428/828.1 |
| 6,865,062 B2 * | 3/2005 | Pinarbasi | 360/324.11 |
| 2002/0041473 A1 * | 4/2002 | Hoshiya et al. | 360/324.11 |
| 2004/0262627 A1 | 12/2004 | Doerner et al. | 257/104 |
| 2005/0264952 A1 * | 12/2005 | Oshima | 360/324.11 |
| 2006/0012926 A1 * | 1/2006 | Parkin | 360/324.2 |

FOREIGN PATENT DOCUMENTS

| | | |
|---|---|---|
| DE | 19700506 A1 | 7/1997 |
| EP | 0892393 A1 | 1/1999 |
| EP | 1059629 A2 | 12/2000 |
| EP | 1059629 A3 | 3/2002 |
| JP | 2001056925 A * | 2/2001 |

* cited by examiner

*Primary Examiner*—Tianjie Chen
(74) *Attorney, Agent, or Firm*—Zilka-Kotab, PC

(57) ABSTRACT

A magnetic head having a free layer and an antiparallel (AP) pinned layer structure spaced apart from the free layer. The AP pinned layer structure includes at least two pinned layers having magnetic moments that are self-pinned antiparallel to each other, the pinned layers being separated by an AP coupling layer constructed of a Ru alloy. The use of a Ru alloy coupling layer significantly increases the pinning field of the AP pinned layer structure over a pure Ru spacer.

24 Claims, 12 Drawing Sheets

MR SENSOR AND THIN FILM MEDIA HAVING ALLOYED RU ANTIPARALLEL SPACER LAYER FOR ENHANCED ANTIPARALLEL EXCHANGE COUPLING

RELATED APPLICATIONS

This application is related to U.S. patent application Ser. Nos. 10/602,507 and 10/602,504, each of which is herein incorporated by reference.

FIELD OF THE INVENTION

The present invention relates to magnetic heads and media, and more particularly, this invention relates to use of Ru alloys to enhance antiparallel exchange coupling in such heads and media.

BACKGROUND OF THE INVENTION

The heart of a computer is a magnetic disk drive which includes a rotating magnetic disk, a slider that has read and write heads (also called writers and sensors), a suspension arm above the rotating disk and an actuator arm that swings the suspension arm to place the read and write heads over selected circular tracks on the rotating disk. The suspension arm biases the slider into contact with the surface of the disk when the disk is not rotating but, when the disk rotates, air is swirled by the rotating disk adjacent an air bearing surface (ABS) of the slider causing the slider to ride on an air bearing a slight distance from the surface of the rotating disk. When the slider rides on the air bearing the write and read heads are employed for writing magnetic impressions to and reading magnetic signal fields from the rotating disk. The read and write heads are connected to processing circuitry that operates according to a computer program to implement the writing and reading functions.

In high capacity disk drives, magnetoresistive (MR) read sensors, commonly referred to as MR heads, are the prevailing read sensors because of their capability to read data from a surface of a disk at greater track and linear densities than thin film inductive heads. An MR sensor detects a magnetic field through the change in the resistance of its MR sensing layer (also referred to as an "MR element") as a function of the strength and direction of the magnetic flux being sensed by the MR layer.

The conventional MR sensor operates on the basis of the anisotropic magnetoresistive (AMR) effect in which an MR element resistance varies as the square of the cosine of the angle between the magnetization in the MR element and the direction of sense current flow through the MR element. Recorded data can be read from a magnetic medium because the external magnetic field from the recorded magnetic medium (the signal field) causes a change in the direction of magnetization of the MR element, which in turn causes a change in resistance of the MR element and a corresponding change in the sensed current or voltage.

Another type of MR sensor is the giant magnetoresistance (GMR) sensor manifesting the GMR effect. In GMR sensors, the resistance of the GMR sensor varies as a function of the spin-dependent transmission of the conduction electrons between ferromagnetic layers separated by a non-magnetic layer (spacer) and the accompanying spin-dependent scattering which takes place at the interface of the ferromagnetic and non-magnetic layers and within the ferromagnetic layers.

GMR sensors using only two layers of ferromagnetic material (e.g., Ni—Fe) separated by a layer of non-magnetic material (e.g., copper) are generally referred to as spin valve (SV) sensors. In an SV sensor, one of the ferromagnetic layers, referred to as the pinned layer (reference layer), has its magnetization typically pinned by exchange coupling with an antiferromagnetic (e.g., NiO or Fe—Mn) layer. The pinning field generated by the antiferromagnetic layer should be greater than demagnetizing fields (about 200 Oe) at the operating temperature of the SV sensor (about 120° C.) to ensure that the magnetization direction of the pinned layer remains fixed during the application of external fields (e.g., fields from bits recorded on the disk). The magnetization of the other ferromagnetic layer, referred to as the free layer, however, is not fixed and is free to rotate in response to the field from the recorded magnetic medium (the signal field). U.S. Pat. No. 5,206,590 granted to Dieny et al., incorporated herein by reference, discloses a SV sensor operating on the basis of the GMR effect.

An exemplary high performance read head employs a spin valve sensor for sensing the magnetic signal fields from the rotating magnetic disk. FIG. 1A shows a prior art SV sensor 100 comprising a free layer (free ferromagnetic layer) 110 separated from a pinned layer (pinned ferromagnetic layer) 120 by a-non-magnetic, electrically-conducting spacer layer 115. The magnetization of the pinned layer 120 is fixed by an antiferromagnetic (AFM) layer 130.

FIG. 1B shows another prior art SV sensor 150 with a flux keepered configuration. The SV sensor 150 is substantially identical to the SV sensor 100 shown in FIG. 1A except for the addition of a keeper layer 152 formed of ferromagnetic material separated from the free layer 110 by a non-magnetic spacer layer 154. The keeper layer 152 provides a flux closure path for the magnetic field from the pinned layer 120 resulting in reduced magnetostatic interaction of the pinned layer 120 with the free layer 110. U.S. Pat. No. 5,508,867 granted to Cain et al. discloses a SV sensor having a flux keepered configuration.

Another type of SV sensor is an antiparallel (AP)-pinned SV sensor. In AP-Pinned SV sensors, the pinned layer is a laminated structure of two ferromagnetic layers separated by a non-magnetic coupling layer such that the magnetizations of the two ferromagnetic layers are strongly coupled together antiferromagnetically in an antiparallel orientation. The AP-Pinned SV sensor provides improved exchange coupling of the antiferromagnetic (AFM) layer to the laminated pinned layer structure than is achieved with the pinned layer structure of the SV sensor of FIG. 1A. This improved exchange coupling increases the stability of the AP-Pinned SV sensor at high temperatures which allows the use of corrosion resistant antiferromagnetic materials such as NiO for the AFM layer.

Referring to FIG. 2A, an AP-Pinned SV sensor 200 comprises a free layer 210 separated from a laminated AP-pinned layer structure 220 by a nonmagnetic, electrically-conducting spacer layer 215. The magnetization of the laminated AP-pinned layer structure 220 is fixed by an AFM layer 230. The laminated AP-pinned layer structure 220 comprises a first ferromagnetic layer 226 and a second ferromagnetic layer 222 separated by an antiparallel coupling layer (APC) 224 of nonmagnetic material. The two ferromagnetic layers 226, 222 ($FM_1$ and $FM_2$) in the laminated AP-pinned layer structure 220 have their magnetization directions oriented antiparallel, as indicated by the arrows 227, 223 (arrows pointing out of and into the plane of the paper respectively).

A key requirement for optimal operation of an SV sensor is that the pinned layer should be magnetically saturated perpendicular to the air bearing surface. Lack of magnetic saturation in the pinned layer leads to reduced signal or dynamic range. Factors leading to a loss of saturation include demagnetizing fields at the edge of the pinned layer, magnetic fields from recorded data and from longitudinal biasing regions, current induced fields and the coupling field to the free layer.

Analysis of the magnetic state of pinned layers in small sensors (a few microns or less in width), reveals that due primarily to the presence of large demagnetizing fields at the sensor edges the magnetization is not uniform over the area of the pinned layer. FIG. 2B shows a perspective view of an SV sensor 250. The SV sensor 250 is formed of a sensor stripe 260 having a front edge 270 at the ABS and extending away from the ABS to a rear edge 272. Due to the large demagnetizing fields at the front edge 270 and the rear edge 272 of the sensor stripe 260, the desired perpendicular magnetization direction is achieved only at the center portion 280 of the pinned layer stripe, while the magnetization tends to be curled into a direction parallel to the ABS at the edges of the stripe. The extent of these curled regions is controlled by the magnetic stiffness of the pinned layer.

As mentioned above, prior art AP-Pinned SV sensors use an AFM in order to pin the pinned layer magnetization so that the pinned layers do not move around when the head is reading data from the disk, upon application of external magnetic fields, etc. The AFM layers are typically very thick, on the order of 150-200 Å. Due to the large overall thickness, such sensors are typically not practical for use in applications where a thin head is desirable.

What is therefore needed is an AP-Pinned SV sensor having improved AP pinning, allowing use of a thinner AFM. What is further needed is a way to increase the pinning of AP-Pinned layers.

Another technology which uses AP-Pinned layers is fabrication of magnetic media. Conventional thin-film type magnetic media, wherein a fine-grained polycrystalline magnetic alloy layer serves as the active recording layer, are generally classified as "longitudinal" or "perpendicular", depending upon the orientation of the magnetic domains of the grains of magnetic material.

A portion of a conventional longitudinal recording, thin-film, hard disk-type magnetic recording medium 300 commonly employed in computer-related applications is schematically illustrated in FIG. 3 in simplified cross-sectional view, and comprises a substantially rigid, non-magnetic metal substrate 302, typically of aluminum (Al) or an aluminum-based alloy, such as an aluminum-magnesium (Al—Mg) alloy, having sequentially deposited or otherwise formed on a surface 302 A thereof a plating layer 304, such as of amorphous nickel-phosphorus (Ni—P); one or more polycrystalline underlayers 306, typically of Cr or a Cr-based alloy, a magnetic recording layer 308, comprised of one or more layers of cobalt (Co)-based alloys with one or more of platinum (Pt), Cr, boron (B), etc.; a protective overcoat layer 310, typically containing carbon (C), e.g., diamond-like carbon ("DLC"); and a lubricant topcoat layer 312, e.g., of a perfluoropolyether. Each of layers 304-310 may be deposited by suitable physical vapor deposition ("PVD") techniques, such as sputtering, and layer 312 is typically deposited by dipping or spraying. Glass substrates are also typically used for longitudinal media. For media on glass substrates, the plated NiP layer 304 is omitted and additional seed layers are added between the substrate surface 302 A and the underlayers 306.

In operation of medium 300, the magnetic layer 308 is locally magnetized by a write transducer, or write head, to record and thereby store data/information therein. The write transducer or head creates a highly concentrated magnetic field which alternates direction based on the bits of information to be stored. When the local magnetic field produced by the write transducer is greater than the coercivity of the material of the recording medium layer 308, the grains of the polycrystalline material at that location are magnetized in the direction of the applied magnetic field. The grains retain their magnetization after the magnetic field applied thereto by the write transducer is removed. The magnetization of the recording medium layer 308 can subsequently produce an electrical response in a read transducer, or sensor, allowing the stored information to be read.

Efforts are continually being made with the aim of increasing the areal recording density, i.e., the bit density, or bits/unit area, and signal-to-medium noise ratio ("SMNR") of the magnetic media. However, when the bit density of longitudinal media is increased above about 50 Gb/in$^2$, thermal instability of the magnetization is encountered when the necessary reduction in grain size approaches the superparamagnetic limit. Such thermal instability can, inter alia, cause undesirable decay of the output signal of hard disk drives, and in extreme instances, result in total data loss and collapse of the magnetic bits.

One proposed solution to the problem of thermal instability arising from the very small grain sizes associated with ultra-high recording density magnetic recording media, is to increase the crystalline anisotropy in order to compensate for the smaller grain sizes. However, this approach is limited by the field provided by the writing head.

Another proposed solution to the problem of thermal instability of very fine-grained magnetic recording media is to provide stabilization via coupling of the ferromagnetic recording layer with another ferromagnetic layer or an anti-ferromagnetic layer.

U.S. Pat. No. 6,280,813 describes a magnetic recording medium wherein the magnetic recording layer is at least two ferromagnetic films antiferromagnetically coupled together across a nonferromagnetic spacer film. In this type of magnetic media, referred to as AFC media, the magnetic moments of the two antiferromagnetically-coupled films are oriented antiparallel, with the result that the net remnant magnetization-thickness product (Mrt) of the recording layer is the difference in the Mrt values of the two ferromagnetic films. This allows Mrt to be lowered as required for high bit density while maintaining the necessary grain volume (V) needed for thermal stability. The ferromagnetic film closer to the head (the master layer) is typically made thicker than the film farther from the head (the slave layer) such that the net Mrt is greater than zero. The interface exchange energy density, J, between the ferromagnetic layers is a key parameter in determining the potential increase in stability. Higher J values allow a thicker slave layer to be used such that the higher V can be obtained for the same Mrt.

In order to achieve optimal performance of AFC media, it is important to have good epitaxial growth of the magnetic layers through the spacer layer with in-plane alignment of the Co-alloy c-axis. Since the lattice constant of Ru is larger than the typical Co-alloys, improved epitaxy across the spacer layer can be achieved using Ru-alloys that reduce the lattice parameter.

Accordingly, there exists a need for improved methodology for providing thermally stable, high areal density magnetic recording media, e.g., longitudinal media, with large interface exchange energy density, J, optimal microstructure and crystallographic orientation (i.e., in-plane alignment of the c-axis), and reduced or optimized lattice mismatch between vertically separated ferromagnetic layers and a non-magnetic spacer layer (such as of a Ru-based material) providing anti-ferromagnetic coupling (AFC) of the ferromagnetic layers, wherein each of the ferromagnetic layers is formed of a ferromagnetic alloy composition similar to compositions conventionally employed in fabricating longitudinal magnetic recording media, which methodology can be implemented at a manufacturing cost compatible with that of conventional manufacturing technologies for forming high areal density magnetic recording media. There also exists a need for improved, high areal density magnetic recording media, e.g., in disk form, which media include at least one pair of anti-ferromagnetically coupled ferromagnetic alloy layers separated by a non-magnetic spacer layer, wherein each of the ferromagnetic layers is formed of a ferromagnetic alloy composition similar to compositions conventionally utilized in longitudinal magnetic recording media (such as Co-based alloys) and the lattice mismatch between each of the ferromagnetic layers and the non-magnetic spacer layer is reduced or optimized, leading to improved thermal stability.

The present invention, therefore, addresses and solves problems attendant upon forming high areal recording density magnetic recording media, e.g., in the form of hard disks, which media utilize anti-ferromagnetic coupling between pairs of ferromagnetic layers for enhancing thermal stability, while providing full compatibility with all aspects of conventional automated manufacturing technology. Moreover, manufacture and implementation of the present invention can be obtained at a cost comparable to that of existing technology.

SUMMARY OF THE INVENTION

The present invention overcomes the drawbacks and limitations described above by providing a magnetic head having a free layer and an antiparallel (AP) pinned layer structure spaced apart from the free layer. The AP pinned layer structure includes at least two pinned layers having magnetic moments that are self-pinned antiparallel to each other, the pinned layers being separated by an AP coupling layer constructed of a Ru alloy. The inventors have found that use of a Ru alloy coupling layer significantly increases the pinning field of the AP pinned layer structure over a pure Ru spacer. This increased pinning field in turn provides greater stability of the head structure.

In a preferred embodiment, Ru alloy includes a ferromagnetic material, such as Fe, Co, CoFe, NiFe, and Ni. The thickness of the AP coupling layer is preferably in the range of about 4 Å to 20 Å.

The head described herein may form part of a GMR head, a CPP GMR sensor, a CIP GMR sensor, a CPP tunnel valve sensor, etc. for use in a magnetic storage system.

The Ru alloy also has application for use in a magnetic recording medium. Such a magnetic recording medium includes a ferromagnetic recording layer, a second layer anti-ferromagnetically coupled to the recording layer, and a coupling layer positioned between the recording layer and the second layer, the coupling layer being constructed of a Ru alloy comprising Ru and a ferromagnetic metal.

Other aspects and advantages of the present invention will become apparent from the following detailed description, which, when taken in conjunction with the drawings, illustrate by way of example the principles of the invention.

BRIEF DESCRIPTION OF THE DRAWINGS

For a fuller understanding of the nature and advantages of the present invention, as well as the preferred mode of use, reference should be made to the following detailed description read in conjunction with the accompanying drawings.

BEST MODE FOR CARRYING OUT THE INVENTION

The following description is the best embodiment presently contemplated for carrying out the present invention. This description is made for the purpose of illustrating the general principles of the present invention and is not meant to limit the inventive concepts claimed herein.

Figure 1A:
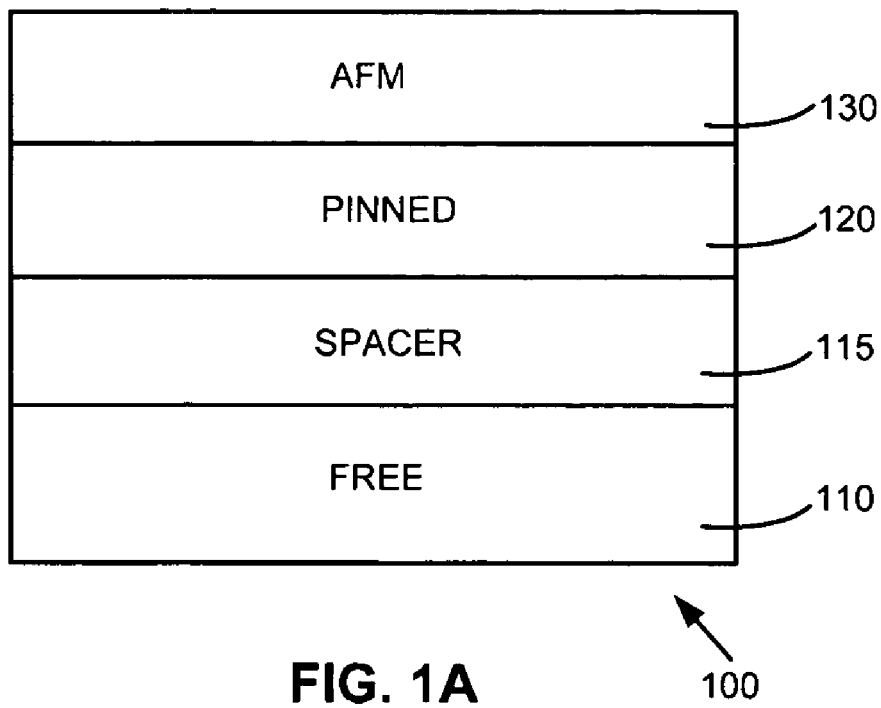
FIG. 1A is an air bearing surface view, not to scale, of a prior art spin valve (SV) sensor.
Figure 1B:
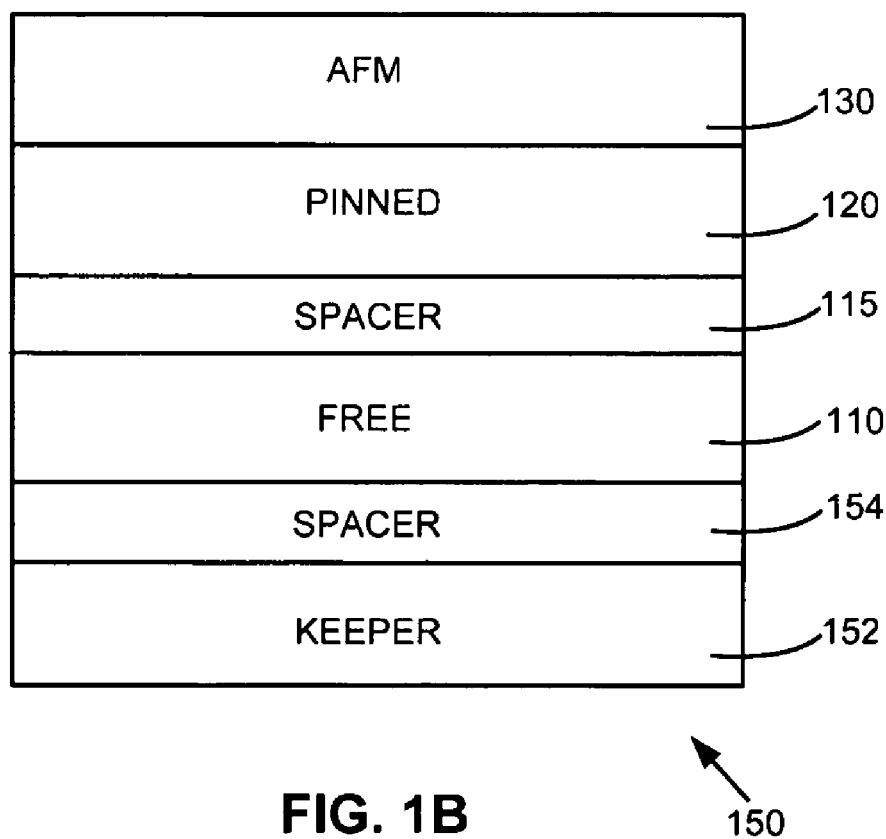
FIG. 1B is an air bearing surface view, not to scale, of a prior art keepered SV sensor.
Figure 2A:
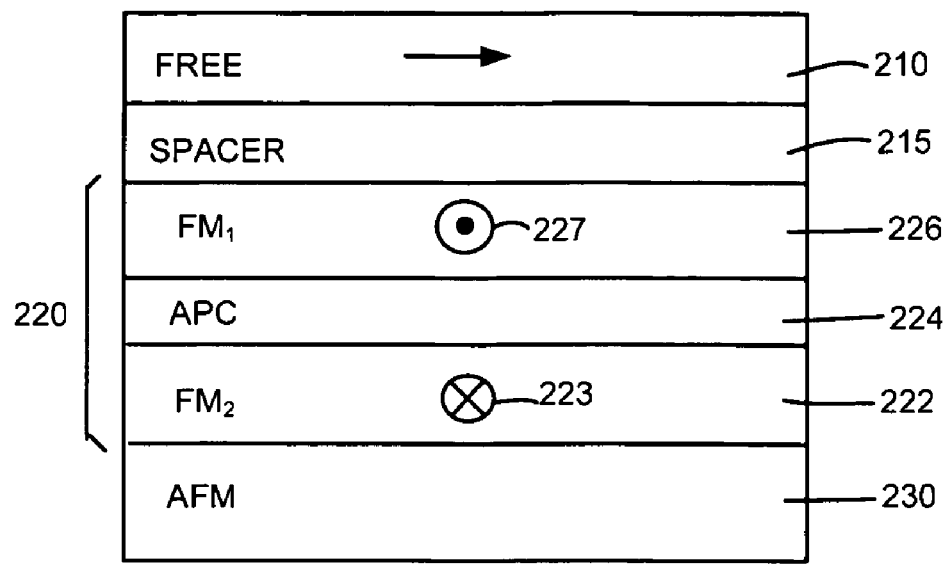
FIG. 2A is an air bearing surface view, not to scale, of a prior art AP-Pinned SV sensor.
Figure 2B:
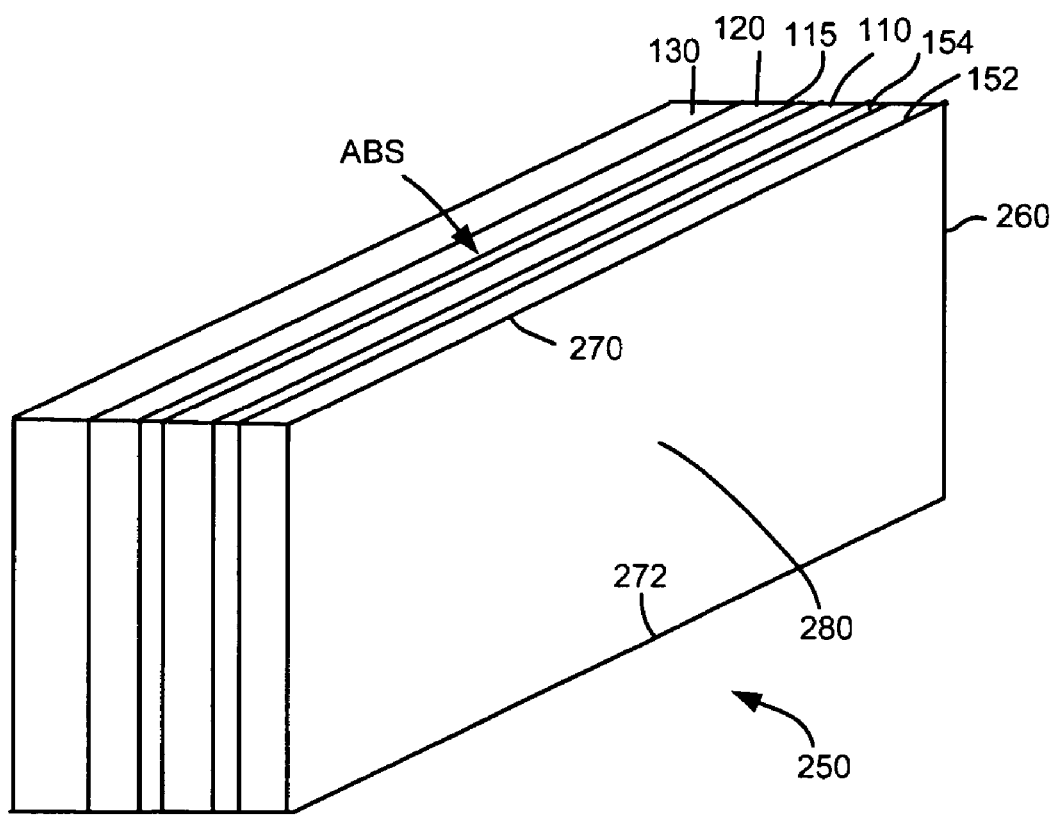
FIG. 2B is a perspective view, not to scale, of a prior art AP-Pinned SV sensor.
Figure 3:
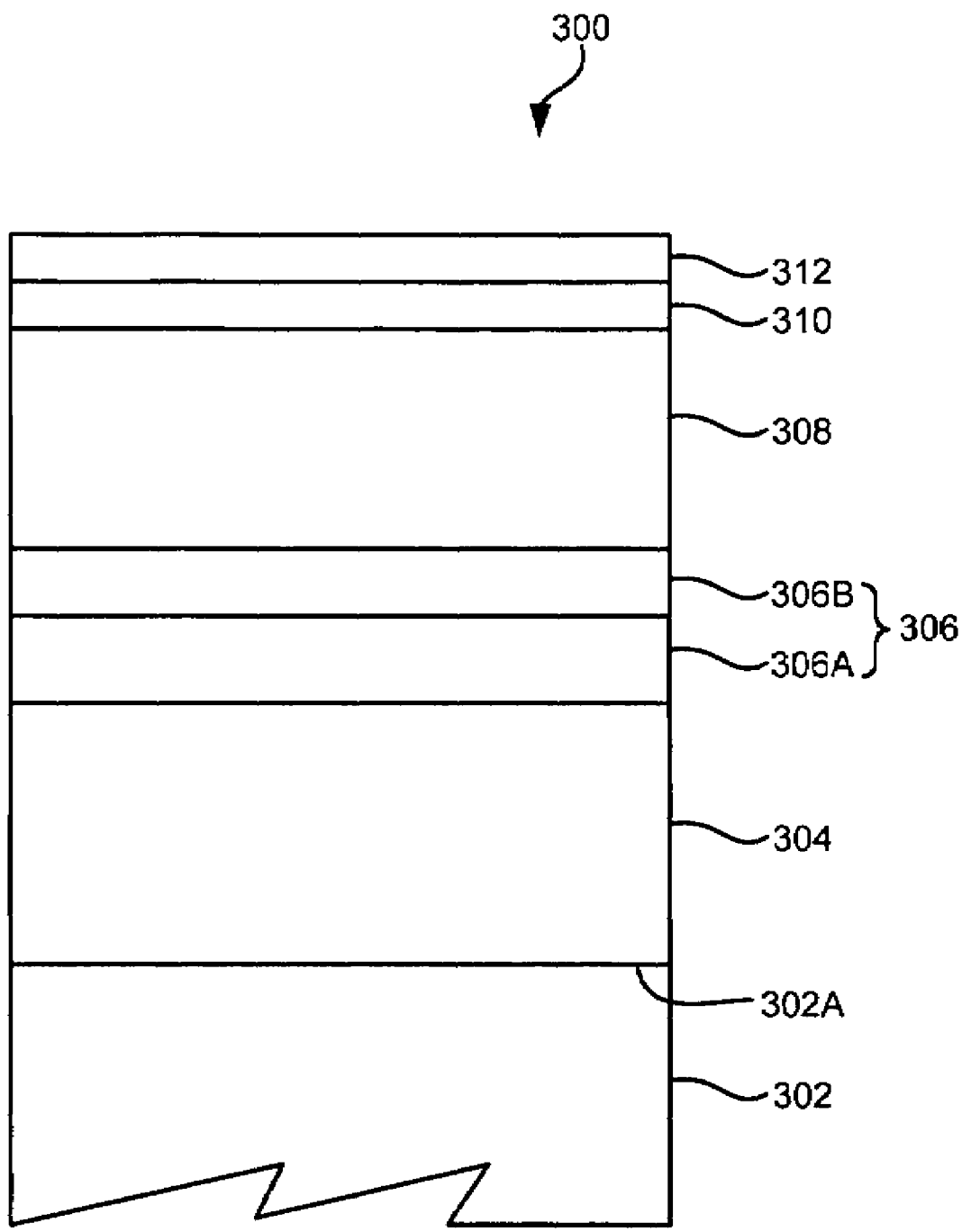
FIG. 3 is a partial cross sectional view of a portion of a conventional thin film, longitudinal type magnetic disk recording medium, not to scale.
Figure 4:
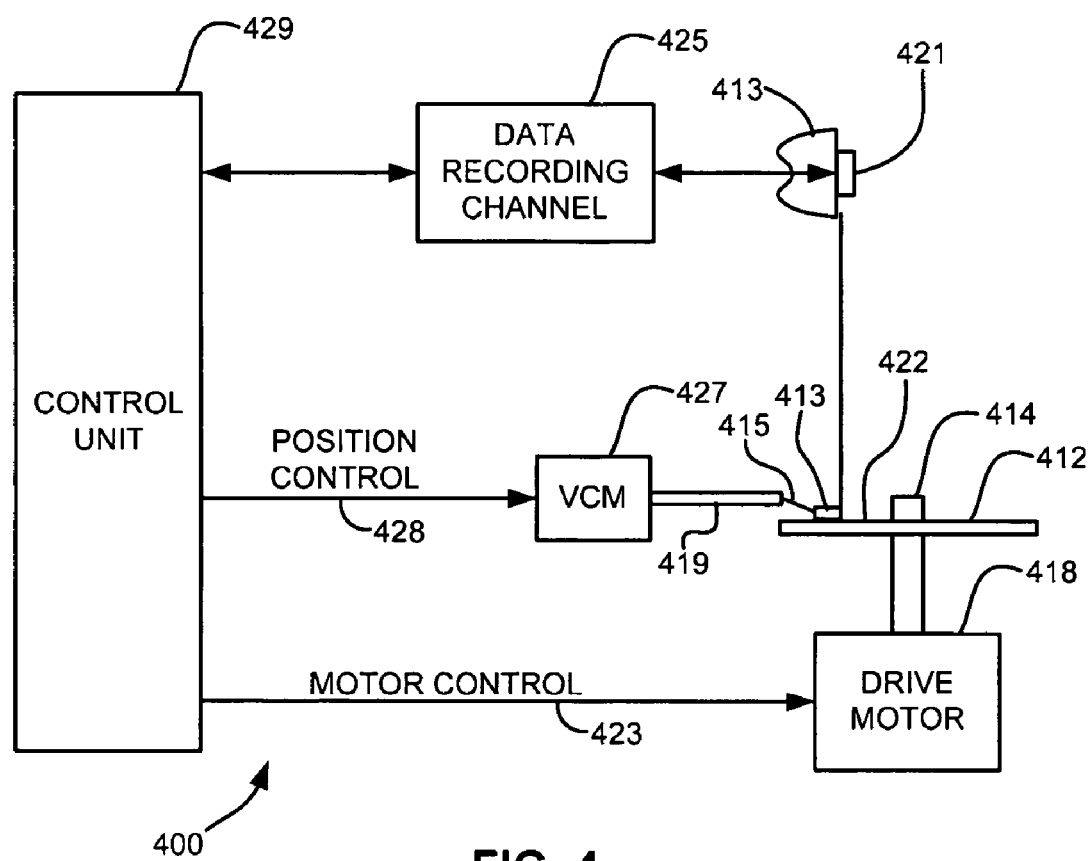
FIG. 4 is a simplified drawing of a magnetic recording disk drive system.

Referring now to FIG. 4, there is shown a disk drive 400 embodying the present invention. As shown in FIG. 4, at least one rotatable magnetic disk 412 is supported on a spindle 414 and rotated by a disk drive motor 418. The magnetic recording on each disk is in the form of an annular pattern of concentric data tracks (not shown) on the disk 412.

At least one slider 413 is positioned near the disk 412, each slider 413 supporting one or more magnetic read/write heads 421. More information regarding such heads 421 will be set forth hereinafter. As the disks rotate, slider 413 is moved radially in and out over disk surface 422 so that heads 421 may access different tracks of the disk where desired data are recorded. Each slider 413 is attached to an actuator arm 419 by means way of a suspension 415. The suspension 415 provides a slight spring force which biases slider 413 against the disk surface 422. Each actuator arm 419 is attached to an actuator means 427. The actuator means 427 as shown in FIG. 4 may be a voice coil motor (VCM). The VCM comprises a coil movable within a fixed magnetic field, the direction and speed of the coil movements being controlled by the motor current signals supplied by controller 429.

During operation of the disk storage system, the rotation of disk 412 generates an air bearing between slider 413 and disk surface 422 which exerts an upward force or lift on the slider. The air bearing thus counter-balances the slight spring force of suspension 415 and supports slider 413 off and slightly above the disk surface by a small, substantially constant spacing during normal operation.

The various components of the disk storage system are controlled in operation by control signals generated by control unit 429, such as access control signals and internal clock signals. Typically, control unit 429 comprises logic control circuits, storage means and a microprocessor. The control unit 429 generates control signals to control various system operations such as drive motor control signals on line 423 and head position and seek control signals on line 428. The control signals on line 428 provide the desired current profiles to optimally move and position slider 413 to the desired data track on disk 412. Read and write signals are communicated to and from read/write heads 421 by way of recording channel 425.

The above description of a typical magnetic disk storage system, and the accompanying illustration of FIG. 4 are for representation purposes only. It should be apparent that disk storage systems may contain a large number of disks and actuators, and each actuator may support a number of sliders.

Figure 5:
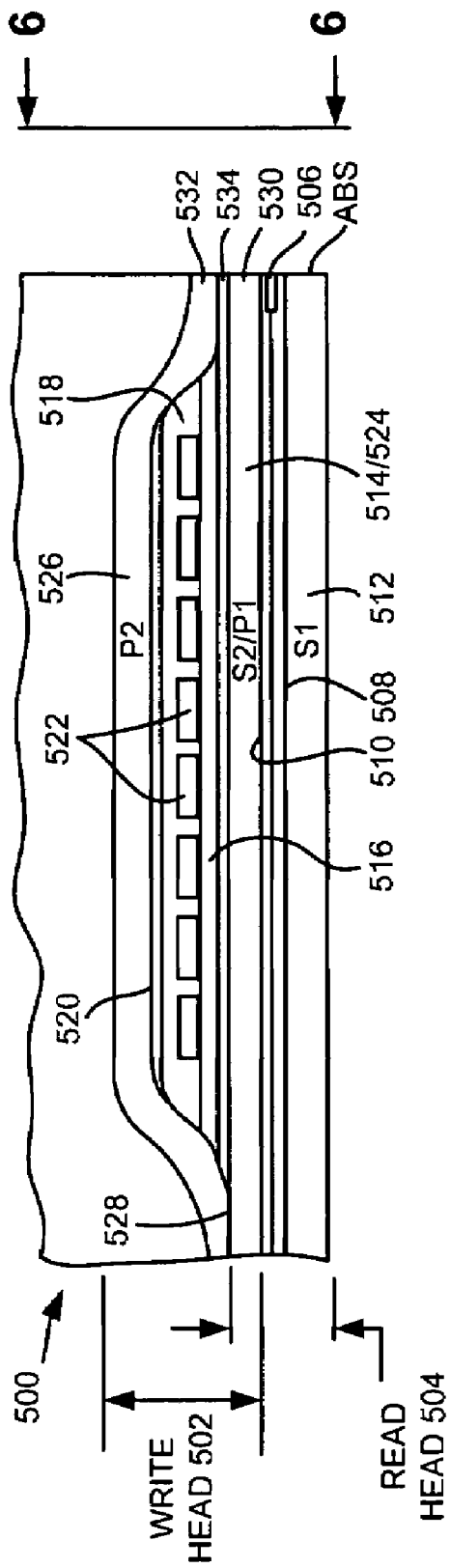
FIG. 5 is a partial view of the slider and a merged magnetic head.
Figure 6:
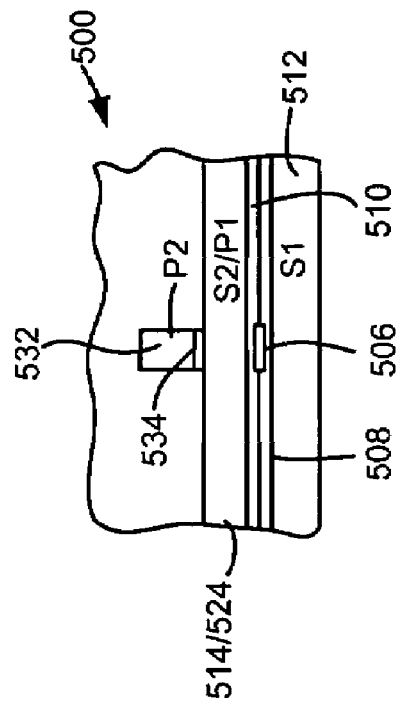
FIG. 6 is a partial ABS view, not to scale, of the slider taken along plane 6-6 of FIG. 5 to show the read and write elements of the merged magnetic head.

FIG. 5 is a side cross-sectional elevation view of a merged magnetic head 500, which includes a write head portion 502 and a read head portion 504, the read head portion employing a dual spin valve sensor 506 of the present invention. FIG. 5 is an ABS view of FIG. 5. The spin valve sensor 506 is sandwiched between nonmagnetic electrically insulative first and second read gap layers 508 and 510, and the read gap layers are sandwiched between ferromagnetic first and second shield layers 512 and 514. In response to external magnetic fields, the resistance of the spin valve sensor 506 changes. A sense current ($I_s$) conducted through the sensor causes these resistance changes to be manifested as potential changes. These potential changes are then processed as readback signals by the processing circuitry 429 shown in FIG. 4.

The write head portion 502 of the magnetic head 500 includes a coil layer 522 sandwiched between first and second insulation layers 516 and 518. A third insulation layer 520 may be employed for planarizing the head to eliminate ripples in the second insulation layer caused by the coil layer 522. The first, second and third insulation layers are referred to in the art as an "insulation stack". The coil layer 522 and the first, second and third insulation layers 516, 518 and 520 are sandwiched between first and second pole piece layers 524 and 526. The first and second pole piece layers 524 and 526 are magnetically coupled at a back gap 528 and have first and second pole tips 530 and 532 which are separated by a write gap layer 534 at the ABS. Since the second shield layer 514 and the first pole piece layer 524 are a common layer this head is known as a merged head. In a piggyback head an insulation layer is located between a second shield layer and a first pole piece layer. First and second solder connections (not shown) connect leads (not shown) from the spin valve sensor 506 to leads (not shown) on the slider 413 (FIG. 4), and third and fourth solder connections (not shown) connect leads (not shown) from the coil 522 to leads (not shown) on the suspension.

Figure 7:
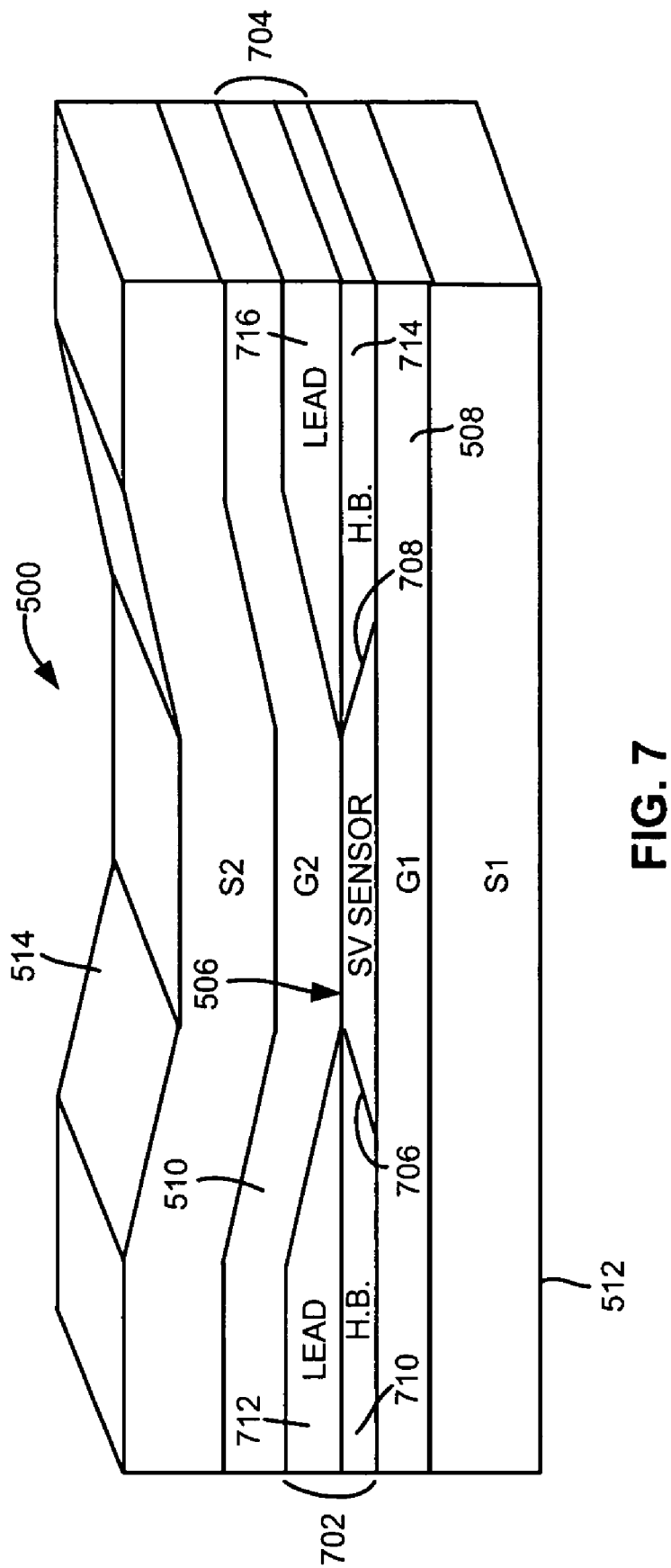
FIG. 7 is an enlarged isometric illustration, not to scale, of the read head with a spin valve sensor.

FIG. 7 is an enlarged isometric ABS illustration of the read head 500 shown in FIG. 5. The read head 500 includes the spin valve sensor 506. First and second hard bias and lead layers 702 and 704 are connected to first and second side edges 706 and 708 of the spin valve sensor. This connection is known in the art as a contiguous junction and is fully described in U.S. Pat. No. 5,018,037 which is incorporated by reference herein. The first hard bias and lead layers 702 include a first hard bias layer 710 and a first lead layer 712 and the second hard bias and lead layers 704 include a second hard bias layer 714 and a second lead layer 716. The hard bias layers 710 and 714 cause magnetic fields to extend longitudinally through the spin valve sensor 506 for stabilizing the magnetic domains therein. The spin valve sensor 506 and the first and second hard bias and lead layers 702 and 704 are located between the nonmagnetic electrically insulative first and second read gap layers 508 and 510. The first and second read gap layers 508 and 510 are, in turn, located between the ferromagnetic first and second shield layers 512 and 514.

The present invention provides a new sensor structure having an enhanced in-stack bias structure with improved AP pinning. The novel structure uses a Ru alloy AP spacer layer that provides a higher AP exchange coupling between pinned layers than using Ru alone. Many types of heads can use the structure described herein, and the structure is particularly adapted to a CPP GMR sensor, a CIP GMR sensor, and a CPP tunnel valve sensor. In the following description, the width of the layers (W) refers to the track width. The sensor height is in a direction into the face of the paper. Unless otherwise described, thicknesses of the individual layers are taken perpendicular to the plane of the associated layer, and are provided by way of example only and may be larger and/or smaller than those listed. Similarly, the materials listed herein are provided by way of example only, and one skilled in the art will understand that other materials may be used without straying from the spirit and scope of the present invention.

CPP GMR

Figure 8:
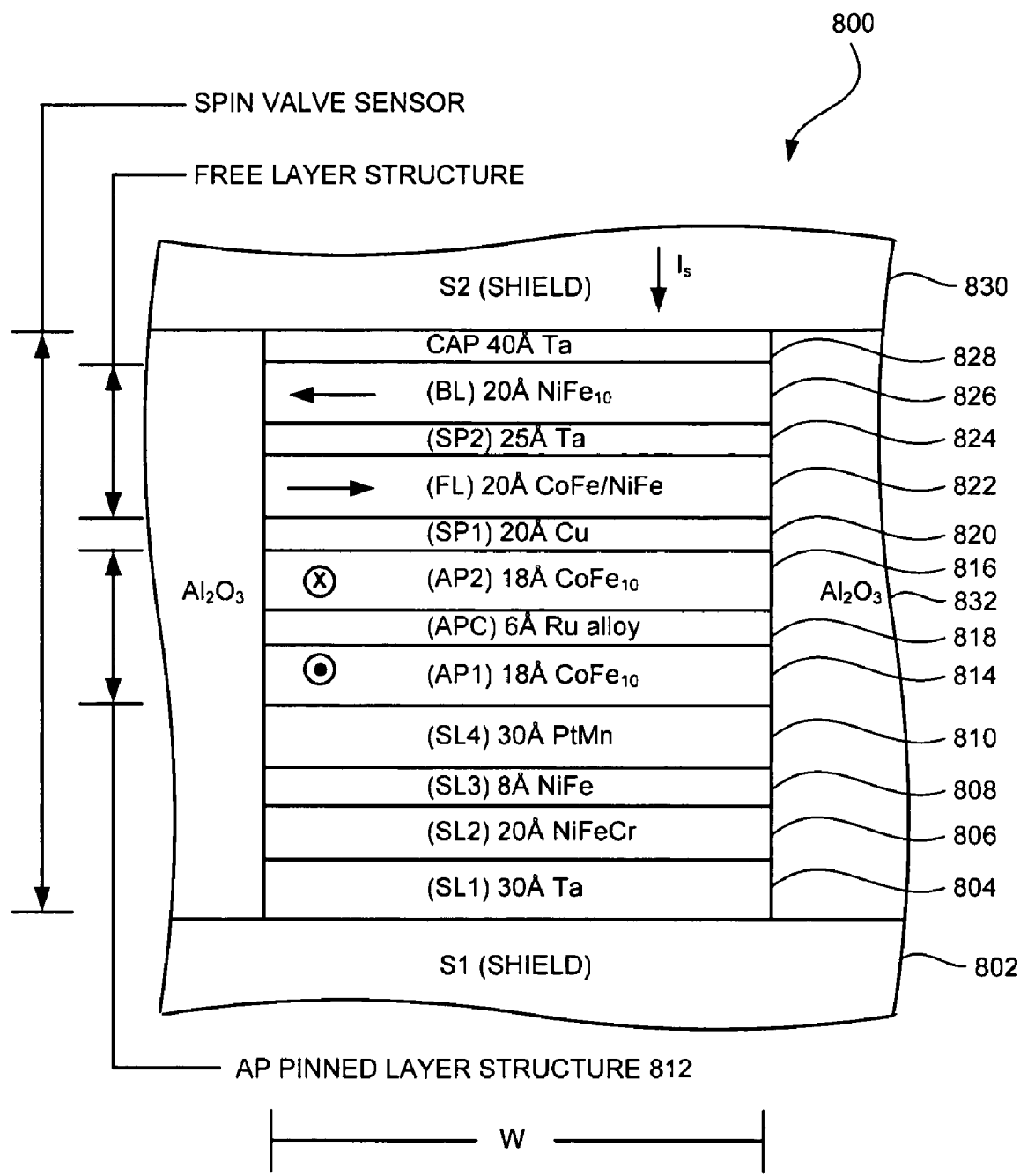
FIG. 8 is an ABS illustration of a CPP GMR sensor, not to scale, according to an embodiment of the present invention.

FIG. 8 depicts an ABS view of a CPP GMR sensor 800 according to one embodiment. "CPP" means that the sensing current ($I_s$) flows from one shield to the other shield in a direction perpendicular to the plane of the layers forming the sensor 800.

As shown in FIG. 8, a first shield layer (S1) 802 is formed on a substrate (not shown). The first shield layer 802 can be of any suitable material, such as permalloy (NiFe).

Seed layers are formed on the first shield layer 802. The seed layers aid in creating the proper growth structure of the layers above them. Illustrative materials formed in a stack from the first shield layer 802 are a layer of Ta (SL1) 804, a layer of NiFeCr (SL2) 806, a layer of NiFe (SL3) 808 and a layer of PtMn (SL4) 810. Illustrative thicknesses of these materials are Ta (30 Å), NiFeCr (20 Å), NiFe (8 Å), and PtMn (30 Å). Note that the stack of seed layers can be varied, and layers may be added or omitted based on the desired processing parameters.

Then an antiparallel (AP) pinned layer structure 812 is formed above the seed layers. As shown in FIG. 8, first and second AP pinned magnetic layers, (AP1) and (AP2) 814, 816, are separated by a thin antiparallel coupling (APC)

layer 818 such that the magnetic moments of the AP pinned layers 814, 816 are self-pinned antiparallel to each other. The pinned layers 814, 816 have a property known as magnetostriction. The magnetostriction of the pinned layers 814, 816 is very positive. The sensor 800 is also under compressive stresses because of its geometry at the ABS, and the configuration of the layer is such that it produces very large compressive stress. The combination of positive magnetostriction and compressive stress causes the pinned layers 814, 816 to develop a magnetic anisotropy that is in a perpendicular direction to the track width. This magnetic coupling through the Ru alloy spacer causes the pinned layers 814, 816 to have antiparallel-oriented magnetizations.

In the embodiment shown in FIG. 8, the preferred magnetic orientation of the pinned layers 814, 816 is for the first pinned layer 814, into the face of the structure depicted (perpendicular to the ABS of the sensor 800 ), and out of the face for the second pinned layer 816. Illustrative materials for the pinned layers 814, 816 are $CoFe_{10}$ (90% Co, 10% Fe), $CoFe_{50}$ (50% Co, 50% Fe), etc. separated by a Ru alloy layer 818. Illustrative thicknesses of the first and second pinned layers 814, 816 are between about 10 Å and 25 Å.

The Ru alloy APC layer 818 includes Ru and a ferromagnetic material, preferably Fe, Co, Ni, CoFe, and NiFe. A list of potential ferromagnetic materials that may be implemented in the Ru alloy of present invention is presented in Table 1, along with their Curie temperatures, the temperature above which they cease to be ferromagnetic.

TABLE 1

| Material | Curie temp. (K) |
|---|---|
| Fe | 1043 |
| Co | 1388 |
| Ni | 627 |
| Gd | 292 |
| Dy | 88 |
| MnAs | 318 |
| MnBi | 630 |
| MnSb | 587 |
| $CrO_2$ | 386 |
| $MnOFe_2O_3$ | 573 |
| $FeOFe_2O_3$ | 858 |
| $NiOFe_2O_3$ | 858 |
| $CuOFe_2O_3$ | 728 |
| $MgOFe_2O_3$ | 713 |
| EuO | 69 |
| $Y_3Fe_5O_{12}$ | 560 |

The Ru alloy layer 818 can be about 4-20 Å, but is preferably selected to provide a saturation field above about 10-30 KOe. In a preferred embodiment, each of the pinned layers 814, 816 is about 18 Å with an Ru layer 818 therebetween of about 5-7 Å. Preferably, the thickness is greater than 4 Å to avoid occurrence of "pinholes" in the deposited structure.

Figure 9:
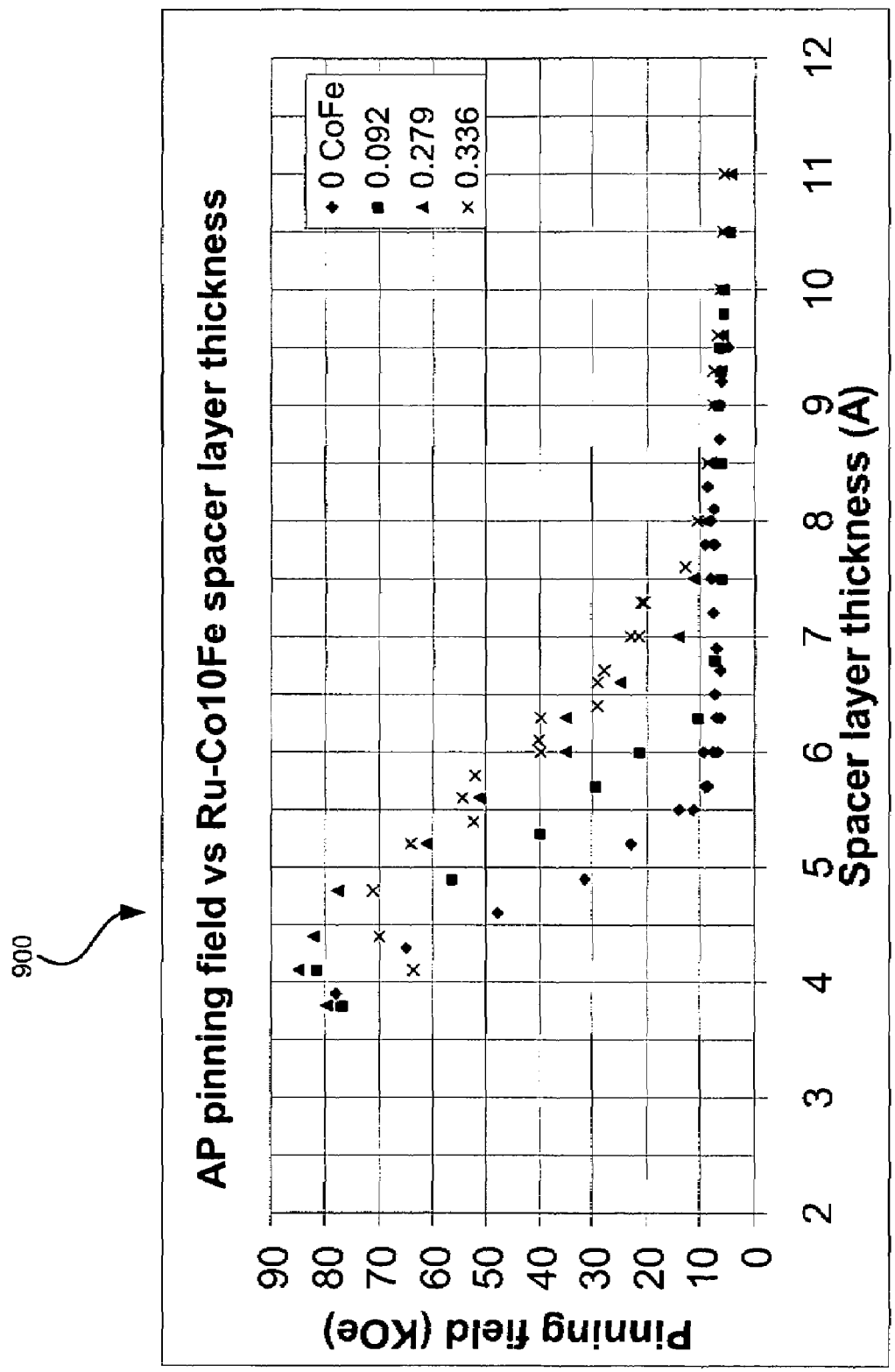
FIG. 9 is a chart depicting pinning field vs. CoFe content in a Ru alloy AP coupling layer of an AP pinned layer structure.

The inventors have found that by adding a minor percentage of a ferromagnetic metal, the pinning strength of the AP pinned layer structure 812 is substantially improved over a pure Ru APC layer. FIG. 9 is a chart 900 that illustrates the AP pinning field of various compositions of a Ru—$Co_{10}Fe_{90}$ APC coupling layer in a structure having the following materials and thicknesses: Ta (36 Å)/Cu (9 Å)/$Co_{10}$Fe (90 Å)/XRu—Y$Co_{10}$Fe (varies)/$Co_{10}$Fe (90 Å)/Cu (9 Å)/Ta (36 Å). Note that the pinning field created by the Ru alloy was so strong, the thicker CoFe layers were needed to make accurate measurements. Thus the actual results obtained for 90 Å thick NiFe layers were then linearly scaled back to represent CoFe layers of 18 Å thick to generate the chart 900. The compositions of the Ru alloy shown are 0% CoFe (100% Ru), 9.2% CoFe, 27.9% CoFe and 33.6% CoFe. As shown, the pinning field generally increases as the concentration of CoFe increases. For instance, at a concentration of 33.6% CoFe and thickness of 6 Å, the pinning field provided by the alloy is 4× (four times) greater than pure Ru at the same thickness.

Figure 10:
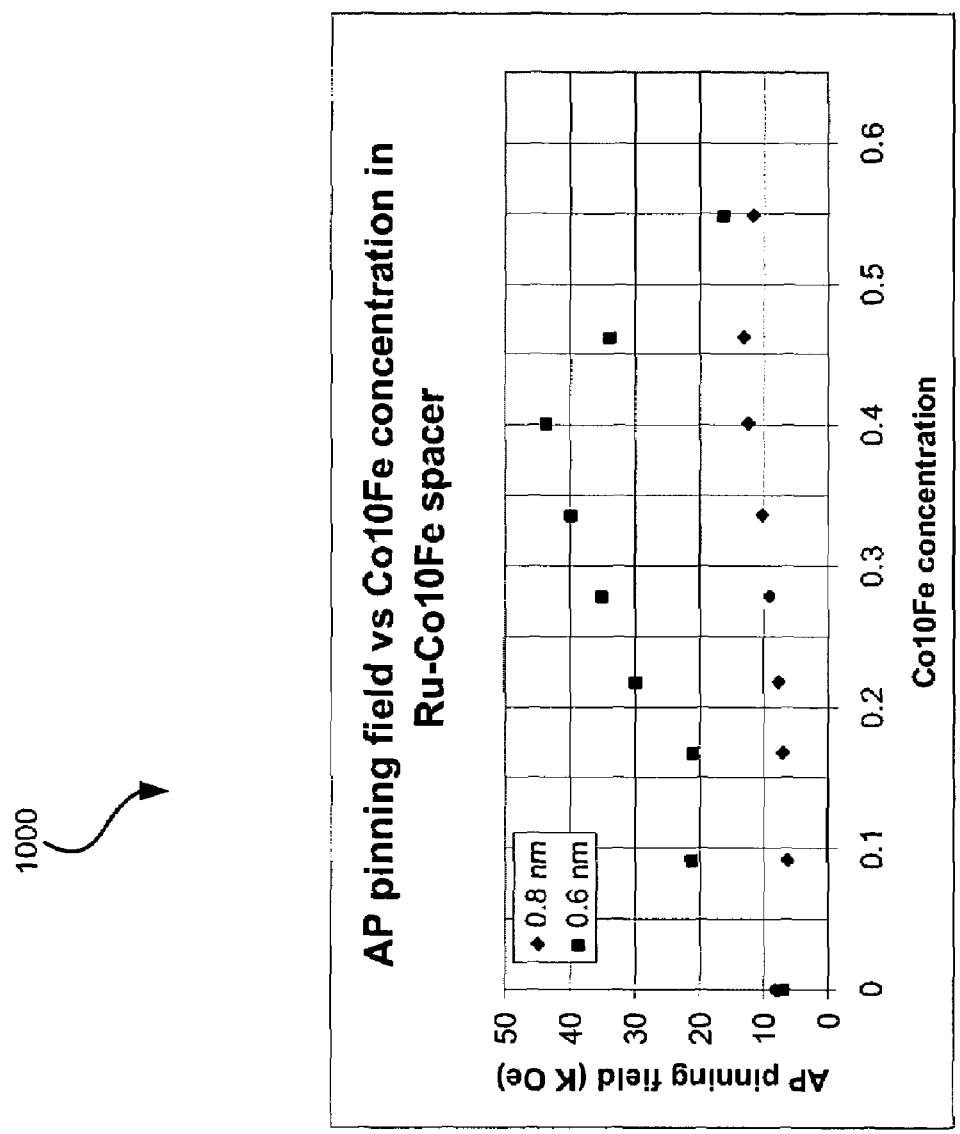
FIG. 10 is a chart depicting pinning field vs. CoFe content in a Ru alloy AP coupling layer of an AP pinned layer structure.

One practicing the invention should note that, as shown in the chart 1000 of FIG. 10, which depicts the pinning field vs. $Co_{10}$Fe concentration in a Ru alloy of 0.6 nm and 0.8 nm, the pinning field increases relatively steadily from 5% CoFe to a point where it reaches a maximum at about 40% CoFe. Beyond 40%, the spacer begins to become magnetic and the pinning field begins to taper off. Thus, the preferred composition, at least when using $Co_{10}$Fe, is between about 5 and 40% CoFe.

Use of an Ru alloy APC layer provides several advantages. A great advantage is the stability that comes with higher pinning strength. Another advantage is that because a thinner layer can be used while achieving strong pinning, the designer has more freedom to select a thickness most desirable for the head.

To form the Ru alloy APC layer 818, the materials can be sputtered from a target of the alloy. However, it may be more advantageous to co-sputter the Ru and alloying material from two targets, as this allows the fabricator to adjust the rate of deposition on the fly, i.e., provides more flexibility to achieve the desired composition.

With continued reference to FIG. 8, a first spacer layer (SP1) 820 is formed above the pinned layer structure 812. Illustrative materials for the first spacer layer 820 include Cu, $CuO_x$, Cu/$CoFeO_x$/Cu stack, etc. The first spacer layer 820 can be about 10-30 Å thick, preferably about 20 Å. In a preferred embodiment, the first spacer layer 820 is formed a thicker layer of $CuMO_x$ (where M is a reactive metal such as Zr, Al, etc). This is used to increase the electrical resistance along the film stack direction of the sensor by constricting the current flow in a $CuMO_x$ matrix.

A free layer (FL) 822 is formed above the first spacer layer 820. The magnetic moment of the free layer 822 is soft and so is susceptible to reorientation from external magnetic forces, such as those exerted by data on disk media. The relative motion of magnetic orientation of the free layer 822 when affected by data bits on disk media creates variations in the sensing current flowing through the sensor 800, thereby creating the signal. Exemplary materials for the free layer 822 are CoFe/NiFe stack, etc. An illustrative thickness of the free layer 822 is about 10-40 Å.

The magnetic orientation of the free layer 822 must be preset during manufacture, otherwise the orientation will be unstable and could move around at random, resulting in a "scrambled" or noisy signal. This instability is a fundamental property of soft materials, making them susceptible to any external magnetic perturbations. Thus, the magnetic orientation of the free layer 822 should be stabilized so that when its magnetic orientation moves, it consistently moves around in a systematical manner rather than a random manner. The magnetic orientation of the free layer 822 should also be stabilized so that it is less susceptible to reorientation, i.e., reversing. The structure disclosed stabilizes the free layer 822.

A second spacer layer (SP2) 824 is formed above the free layer 822. Illustrative materials for the second spacer layer 824 are Ta, Ru, Ta/Ru stack, Cu, etc. An exemplary thickness of the second spacer layer 824 is about 20-30 Å.

An in-stack bias layer (BL) 826 is formed above the second spacer layer 824. The magnetization of the bias layer 826 is pinned parallel to the track width, making the bias layer 826 act as a permanent magnet. The bias layer 826 stabilizes the free layer 822 through exchange coupling. This phenomenon is similar to the AP coupling of the pinned layers, except that the second spacer layer 824 must not be too thin or the free and bias layers may become permanently pinned and the head rendered practically ineffective.

Exemplary materials for the bias layer 826 are $NiFe_{10}$, CoNiNb, NiFeX (X=Cr, Mo, Rh, etc.), etc. An illustrative thickness of the bias layer 826 is about 10-40 Å, and is preferably selected such that it has a magnetic thickness comparable to the magnetic thickness of the free layer 822 to provide a flux closed structure where the magnetic poles at the free layer edges are eliminated. Also note that where NiFe or NiFeX is used, the Ni/Fe ratio is preferably kept at about ≧90/10 to obtain a large negative magnetostriction, e.g., about $-2 \times 10E^{-5}$. This magnetostriction together with compressive stress yields a Hk of greater than about 750 Oe at the free layer, and preferably about 1000 Oe at the bias layer.

The thickness of the second spacer layer 824 is constructed such that the magnetic field created by the bias layer 826 enters the free layer 822, stabilizing the magnetic orientation of the free layer 822, preferably so that the magnetizations of the free and bias layers 822, 826 are antiparallel. Such thickness of the second spacer layer 824 in the exemplary embodiment shown in FIG. 8 is about 20-30 Å thick. Also, a magnetic coupling is created between the free and bias layers 822, 826 through the second spacer layer 824, which enhances the stabilizing effect. Note that the magnetization of the free layer 822 remains soft in spite of the magnetic field of the bias layer 826, thereby maintaining sufficient sensitivity necessary for reading magnetic media.

The magnetization of the bias layer 826 is preferably pinned parallel to the track width as opposed to perpendicular to the ABS. This can be accomplished by causing the bias layer 826 to have a negative magnetostriction by using other materials, such as those listed above, and preferably having a ≧90% Ni content. Further, Cr makes the material even more negative. When Nb is added, the material becomes amorphous (not crystalline), causing it to have a more negative magnetostriction. The negative magnetostriction in combination with large compressive stress (created by the geometry of the layer) creates a magnetic anisotropy which is parallel to the track width W, which in turn causes the magnetic orientation of the bias layer 826 to be pinned parallel to the track width.

A cap (CAP) 828 is formed above the bias layer 826. Exemplary materials for the cap 828 are Ta, Ta/Ru stack, etc. An illustrative thickness of the cap 828 is 20-30 Å.

A second shield layer (S2) 830 is formed above the cap 828. An insulative material 832 such as $Al_2O_3$ is formed on both sides of the sensor 800.

Note that the structure shown in FIG. 8 represents only one possible configuration of a sensor, and one skilled in the art will appreciate that other configurations are possible. For example, multiple AP pinned layer structures can be present, the free layer may be positioned between the seed layers and the AP pinned layer structure, etc. Thus, the structures presented herein are for representative purposes only to demonstrate one possible use of the novel Ru alloy spacer layer.

CPP Tunnel Valve

Figure 11:
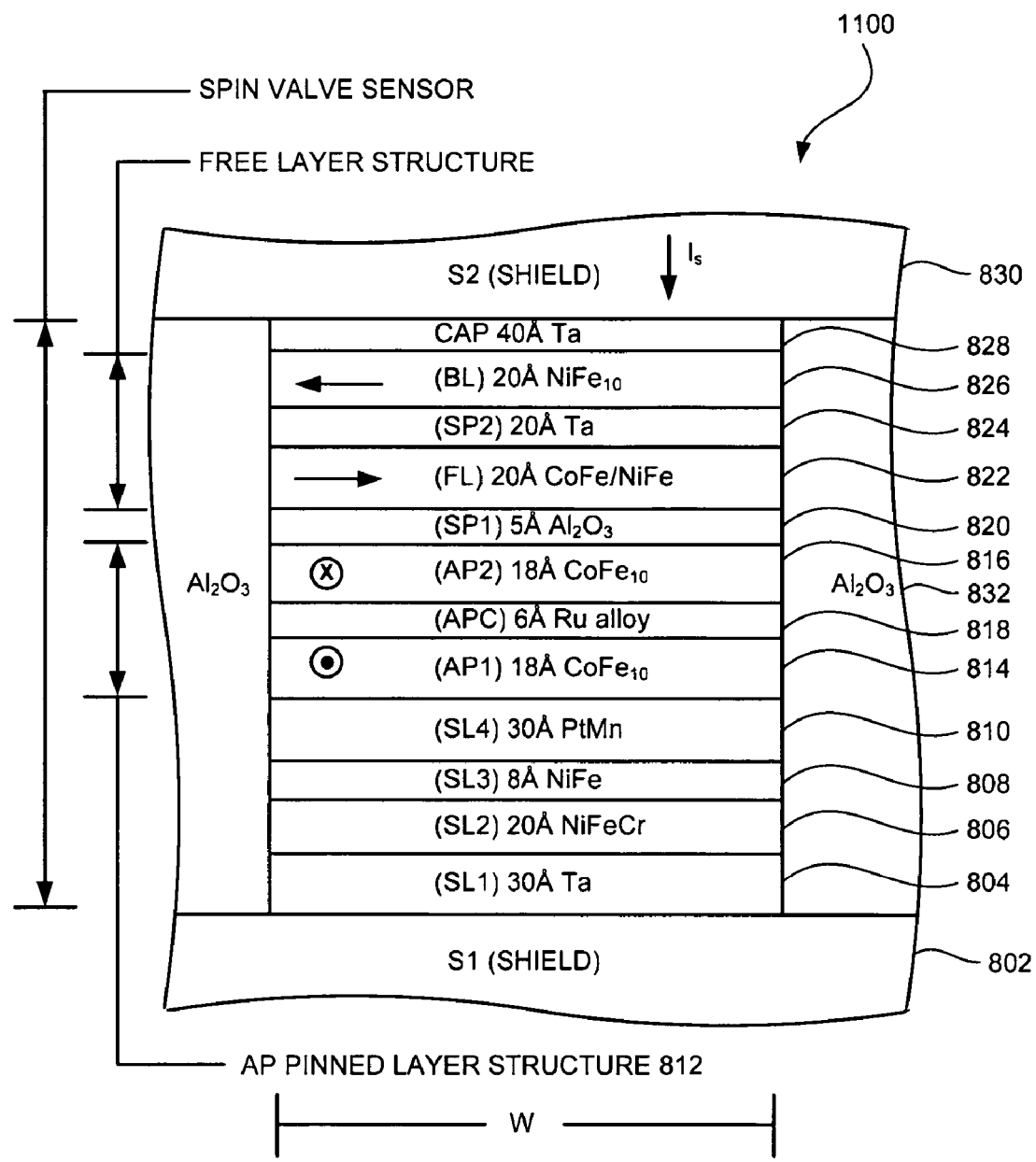
FIG. 11 is an ABS illustration of a CPP tunnel valve sensor, not to scale, according to an embodiment of the present invention.

FIG. 11 depicts an ABS view of a CPP tunnel valve sensor 1100 according to one embodiment. The CPP tunnel valve sensor 1100 generally has the same configuration as the structure shown in FIG. 8, except that the first spacer layer 820 is formed of a dielectric barrier material, such as, $Al_2O_3$, $AlO_x$, $MgO_x$, etc. The first spacer layer 820 is very thin such that the electric current passing through the sensor 1100 "tunnels" through the first spacer layer 820. An illustrative thickness of the first spacer layer 820 is 3-6 Å.

CIP GMR

Figure 12:
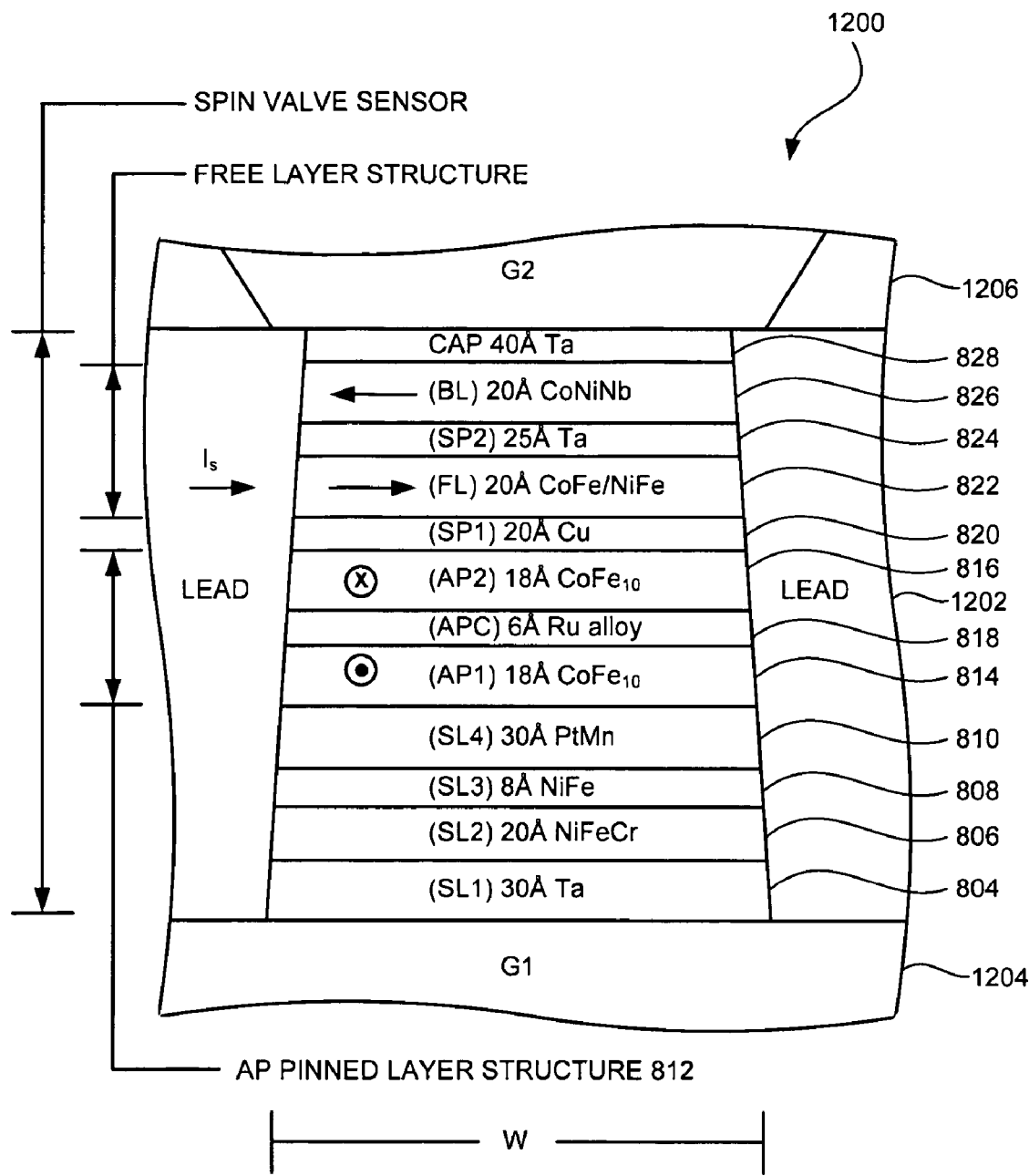
FIG. 12 is an ABS illustration of a CIP GMR sensor, not to scale, according to an embodiment of the present invention.

FIG. 12 depicts an ABS view of a CIP GMR sensor 1200 according to one embodiment. "CIP" means that the sensing current ($I_s$) flows from in a direction parallel to or "in" the plane of the layers forming the sensor 1200. The CIP GMR sensor 1200 generally has the same configuration as the structures shown in FIGS. 8 and 11, except that leads 1202 of conventional materials and thicknesses are formed on opposite sides of the sensor 1200 and the sensor 1200 is sandwiched between an insulative material (G1), (G2) 1204, 1206. Another important difference is that current flows across the track width as opposed to perpendicular to the track width. Because the current can flow through all of the layers, it is desirable to reduce the amount of current flowing through the bias layer 826 so that more current flows through the free layer 822. To achieve this, an electrically resistive material can be selected to form the bias layer 826. Preferably, the material selected to form the bias layer 826 is amorphous so that it has high resistivity. A preferred material is $(Co_{73} Ni_{12})_{85} Nb_{15}$. The material will also have a large magnetostriction, which causes the magnetic orientation of the bias layer 826 to be pinned parallel to the track width. Another way to reduce current shunting is to reduce the amount of current flowing through the AP pinned layer structure 812 so that more current flows through the free layer 822. To achieve this, the second pinned layer 816 can be made smaller than the first pinned layer 814 to reduce shunting of the current.

Magnetic Recording Medium

The Ru alloy spacer layer can also be used as a coupling layer in both longitudinal and perpendicular magnetic media. As discussed above, the recording layer of an ultra-high density magnetic medium may be stabilized by anti-ferromagnetically coupling (AFC) the ferromagnetic recording layer to another layer, thereby giving the recording medium more stability, even at high temperatures.

Figure 13:
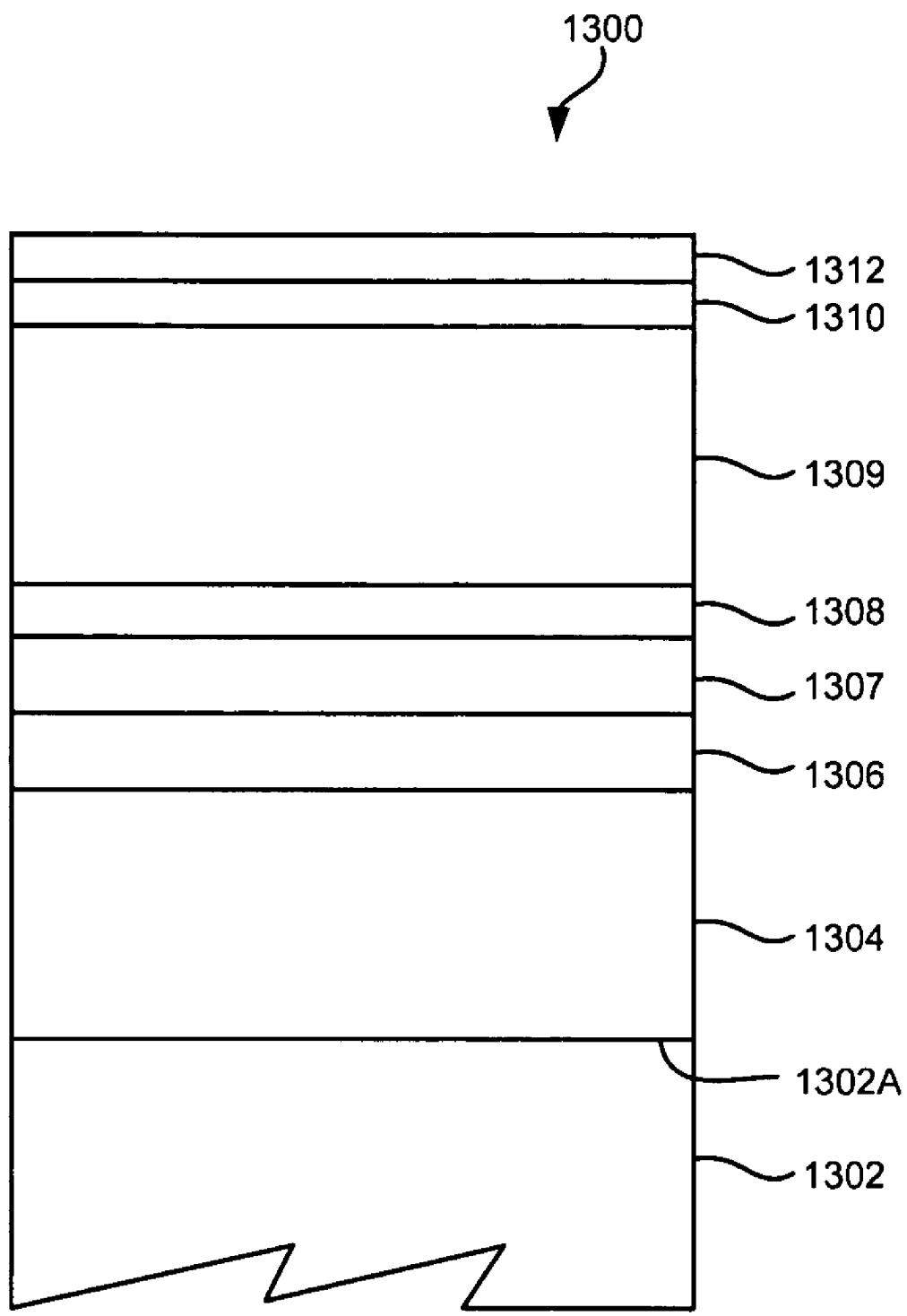
FIG. 13 is a partial cross sectional view of a portion of a thin film, longitudinal type magnetic disk recording medium according to one embodiment, not to scale.

FIG. 13 depicts an illustrative recording medium 1300 implementing a Ru alloy coupling layer. A portion of a longitudinal recording, thin-film, hard disk-type magnetic recording medium 1300 according to one embodiment comprises a substantially rigid, non-magnetic metal substrate 1302, typically of aluminum (Al) or an aluminum-based alloy, such as an aluminum-magnesium (Al—Mg) alloy, having sequentially deposited or otherwise formed on a surface 1302A thereof a plating layer 1304, such as of amorphous nickel-phosphorus (Ni—P); one or more polycrystalline underlayers 1306, typically of Cr or a Cr-based alloy; a slave layer 1307, typically of a cobalt (Co)-based alloy, a coupling layer 1308 of a Ru alloy, e.g., of Ru with Co, Ni, Fe, CoFe, NiFe; a magnetic recording layer 1309, typically comprised of one or more cobalt (Co)-based alloys with one or more of platinum (Pt), Cr, boron (B), etc.; a protective overcoat layer 1310, typically containing carbon (C), e.g., diamond-like carbon ("DLC"); and a lubricant topcoat layer 1312, e.g., of a perfluoropolyether. For media on glass substrates, the plated NiP lyer 1304 is omitted and additional seed layers are added between the glass surface 1302A and the underlayer 1306. Each of layers 1304-1310 may be deposited by suitable physical vapor deposition ("PVD") techniques, such as sputtering, and layer 1312 is typically deposited by dipping or spraying. Again, the structure is provided by way of example only, and one practicing the invention will appreciate that the recording medium implementing the novel coupling layer can have more or less layers, and of potentially different compositions.

The Ru alloy materials described herein provide a stronger AFC between the ferromagnetic recording layer and a second layer than is found with pure Ru. The experimental results presented above would generally hold true for magnetic media as well. Similarly, the medium can be fabricated in much the same way.

The Ru alloy materials, containing ferromagnetic metals as well, have also been found to be more compatible with recording layers constructed of conventional materials such as a Co alloy.

Similar thicknesses as above can also be used for the Ru alloy coupling layer.

A method of use of the medium has been presented above.

While various embodiments have been described above, it should be understood that they have been presented by way of example only, and not limitation. For example, the structures and methodologies presented herein are generic in their application to all MR heads, AMR heads, GMR heads, spin valve heads, etc. Thus, the breadth and scope of a preferred embodiment should not be limited by any of the above-described exemplary embodiments, but should be defined only in accordance with the following claims and their equivalents.

What is claimed is:

1. A magnetic storage system, comprising:
   magnetic media, comprising
      a ferromagnetic recording layer;
      a second layer anti-ferromagnetically coupled to the recording layer; and
      an AP coupling layer positioned between the recording layer and the second layer;
      wherein the AP coupling layer is constructed of a Ru alloy comprising Ru and a ferromagnetic metal
   at least one head for reading from and writing to the magnetic media, each head having:
      a sensor, comprising:
         a free layer;
         an antiparallel (AP) pinned layer structure spaced apart from the free layer,
         wherein the AP pinned layer structure includes at least two pinned layers having magnetic moments that are self-pinned antiparallel to each other, the pinned layers being separated by an AP coupling layer,
         wherein the AP coupling layer is constructed of a Ru alloy,
         wherein the Ru alloy includes between about 5 and about 40% by weight CoFe;
      a writer coupled to the sensor;
   a slider for supporting the head; and
   a control unit coupled to the head for controlling operation of the head.

2. A magnetic head, comprising:
   a free layer;
   an antiparallel (AP) pinned layer structure spaced apart from the free layer,
   wherein the AP pinned layer structure includes at least two pinned layers having magnetic moments that are self-pinned antiparallel to each other, the pinned layers being separated by an AP coupling layer,
   wherein the AP coupling layer is constructed of a Ru alloy, wherein the Ru alloy includes between about 5 and about 40% by weight CoFe.

3. A head as recited in claim 2, wherein the Ru alloy includes a ferromagnetic material.

4. A head as recited in claim 2, wherein the Ru alloy includes Fe.

5. A head as recited in claim 2, wherein the Ru alloy includes Co.

6. A head as recited in claim 2, wherein the Ru alloy includes CoFe.

7. A head as recited in claim 2, wherein the Ru alloy includes NiFe.

8. A head as recited in claim 2, wherein the Ru alloy includes Ni.

9. A head as recited in claim 2, wherein a thickness of the AP coupling layer is less than 8 Å.

10. A head as recited in claim 2, wherein a thickness of the AP coupling layer is between about 4 Å and 20 Å.

11. A head as recited in claim 2, wherein a thickness of the AP coupling layer is between 5 Å and 7 Å.

12. A head as recited in claim 2, wherein the head forms part of a GMR head.

13. A head as recited in claim 2, wherein the head forms part of a CPP GMR sensor.

14. A head as recited in claim 2, wherein the head forms part of a CIP GMR sensor.

15. A head as recited in claim 2, wherein the head forms part of a tunnel valve sensor.

16. A magnetic storage system, comprising:
    magnetic media;
    at least one head for reading from and writing to the magnetic media, each head having:
       a sensor having the structure recited in claim 2;
       a writer coupled to the sensor;
    a slider for supporting the head; and
    a control unit coupled to the head for controlling operation of the head.

17. A magnetic head, comprising:
    a free layer;
    an antiparallel (AP) pinned layer structure spaced apart from the free layer,
    wherein the AP pinned layer structure includes at least two pinned layers having magnetic moments that are self-pinned antiparallel to each other, the pinned layers being separated by an AP coupling layer,
    wherein the AP coupling layer is constructed of a Ru alloy,
    wherein the Ru alloy includes between about 5 and about 40% by weight CoFe.

18. A head as recited in claim 17, wherein a thickness of the AP coupling layer is less than 8 Å.

19. A head as recited in claim 17, wherein a thickness of the AP coupling layer is between about 4 Å and 20 Å.

20. A head as recited in claim 17, wherein a thickness of the AP coupling layer is between 5 Å and 7 Å.

21. A head as recited in claim 17, wherein the head forms part of a GMR head.

22. A head as recited in claim 17, wherein the head forms part of a CPP GMR sensor.

23. A head as recited in claim 17, wherein the head forms part of a CIP GMR sensor.

24. A magnetic head, comprising:
    a free layer;
    an antiparallel (AP) pinned layer structure spaced apart from the free layer,
    wherein the AP pinned layer structure includes at least two pinned layers having magnetic moments that are self-pinned antiparallel to each other, the pinned layers being separated by an AP coupling layer,
    wherein the AP coupling layer is constructed of a Ru alloy comprising about 5 to 40 weight percent NiFe,
    wherein the AP coupling layer has a thickness of between about 5 Å and 7 Å.

* * * * *